(12) United States Patent
Becker

(10) Patent No.: US 12,482,796 B2
(45) Date of Patent: Nov. 25, 2025

(54) OPTOELECTRONIC DEVICE MANUFACTURING METHOD

(71) Applicant: Commissariat à l'Énergie Atomique et aux Énergies Alternatives, Paris (FR)

(72) Inventor: Sébastien Becker, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 530 days.

(21) Appl. No.: 17/743,364

(22) Filed: May 12, 2022

(65) Prior Publication Data
US 2022/0375914 A1   Nov. 24, 2022

(30) Foreign Application Priority Data

May 18, 2021   (FR) ...................................... 2105161

(51) Int. Cl.
*H01L 25/16*   (2023.01)
*H01L 23/00*   (2006.01)

(52) U.S. Cl.
CPC ............ *H01L 25/167* (2013.01); *H01L 24/08* (2013.01); *H01L 24/80* (2013.01);
(Continued)

(58) Field of Classification Search
CPC ....... H01L 25/167; H01L 24/08; H01L 24/80; H01L 2224/08145; H01L 2224/80895; H01L 2224/80896; H01L 2924/12041; H01L 2924/12043; H01L 27/156; H01L 31/173; H01L 33/0093; H01L 33/62;
(Continued)

(56) References Cited

U.S. PATENT DOCUMENTS

| 4,651,001 A * | 3/1987 | Harada ............. H01L 27/14618 |
| | | 250/370.06 |
| 2006/0292744 A1* | 12/2006 | Enquist ................... H01L 24/27 |
| | | 257/E21.705 |

(Continued)

FOREIGN PATENT DOCUMENTS

| EP | 3 624 192 A1 | 3/2020 |
| EP | 3 671 841 A1 | 6/2020 |

OTHER PUBLICATIONS

Preliminary Search Report for French Application No. 2105161, dated Jan. 11, 2022.

*Primary Examiner* — Syed I Gheyas

(74) *Attorney, Agent, or Firm* — Wolf, Greenfield & Sacks, P.C.

(57) ABSTRACT

A method of manufacturing an optoelectronic device, including the steps of: a) forming a photonic device including a plurality of photonic components on a first substrate; b) forming an electronic device including a semiconductor layer coating a second substrate; c) after steps a) and b), bonding the electronic device to the photonic device by direct bonding, and then removing the second substrate; d) after step c), forming, on the upper surface side of the electronic device, electric connection metallizations, the method further including: —after step a) and before step c), a step of deposition of a metal layer continuously extending over the entire upper surface of the device.

14 Claims, 13 Drawing Sheets

(52) U.S. Cl.
CPC .............. *H01L 2224/08145* (2013.01); *H01L 2224/80895* (2013.01); *H01L 2224/80896* (2013.01); *H01L 2924/12041* (2013.01); *H01L 2924/12043* (2013.01)

(58) Field of Classification Search
CPC ......... H01L 27/14634; H01L 27/14636; H01L 27/1469; H10F 55/255; H10F 39/018; H10F 39/809; H10F 39/811; H10H 20/018; H10H 20/857; H10H 29/142
See application file for complete search history.

(56) References Cited

U.S. PATENT DOCUMENTS

| 2016/0336307 | A1* | 11/2016 | Herrmann | H01L 33/486 |
| 2017/0201662 | A1* | 7/2017 | Kim | H04N 23/45 |
| 2020/0091224 | A1* | 3/2020 | Bono | H01L 27/1443 |

* cited by examiner

OPTOELECTRONIC DEVICE MANUFACTURING METHOD

CROSS-REFERENCE TO RELATED APPLICATIONS

This application claims priority to French application number 2105161, filed May 18, 2021. The contents of which is incorporated herein by reference in its entirety.

TECHNICAL BACKGROUND

The present disclosure generally concerns the manufacturing of optoelectronic devices. It more particularly concerns the manufacturing of devices comprising light emitting and/or receiving photonic components, monolithically integrated on a microelectronic integrated circuit, for example, of CMOS ("Complementary Metal Oxide Semiconductor") type.

PRIOR ART

Various solutions have been provided to monolithically integrate light emitting and/or receiving photonic components on a CMOS-type microelectronic circuit.

Known solutions however have various disadvantages and/or various limitations that it would be desirable to totally or partly overcome.

SUMMARY OF THE INVENTION

An embodiment provides an optoelectronic device manufacturing method, comprising the steps of:
  a) forming a photonic device comprising a plurality of photonic components formed inside and on top of a stack of one or a plurality of semiconductor layers coating a first substrate;
  b) forming an electronic device comprising a semiconductor layer coating a second substrate;
  c) after steps a) and b), bonding the electronic device to the upper surface of the photonic device by direct bonding, and then removing the second substrate;
  d) after step c), forming, on the upper surface side of the electronic device, electric connection metallizations contacting electronic components of the electronic device and the photonic components,
  the method further comprising:
    after step a) and before step c), a step of deposition of a metal layer continuously extending over the entire upper surface of the photonic device; and
    after step c), a step of forming, from the upper surface of the electronic device, of a plurality of insulating trenches vertically extending through the electronic device and the metal layer, said insulating trenches delimiting in the metal layer a plurality of electrodes electrically insulated from one another.

According to an embodiment, the method comprises, before step c), the forming of a plurality of electronic components inside and on top of the semiconductor layer coating the second substrate.

According to an embodiment, the method further comprises, after step c), the forming of a plurality of electronic components inside and on top of the semiconductor layer.

According to an embodiment, at step c), the electronic device is bonded to the upper surface of the photonic device by direct full plate metal-to-metal, dielectric-to-dielectric, or semiconductor-to-semiconductor bonding.

According to an embodiment, the method further comprises, after step d), a step of forming of an interconnection stack on the upper surface side of the electronic device.

According to an embodiment, the method further comprises, after step d), a step of bonding, on the upper surface side of the first electronic device, of a second electronic device comprising a plurality of electronic components formed inside and on top of a semiconductor layer coating a third substrate.

According to an embodiment, the photonic components comprise photosensitive diodes and/or LEDs.

According to an embodiment, the photonic components comprise microbolometers.

According to an embodiment, step a) comprises a step of transfer and bonding of a first active photonic stack to a second active photonic stack.

According to an embodiment, the method comprises, after the bonding of the first active photonic stack to the second active photonic stack and before step c), a step of forming of an insulated conductive via crossing the first active photonic stack and contacting the second active photonic stack.

According to an embodiment, the first active photonic stack is an active photosensitive diode stack and the second active photonic stack is an active LED stack.

According to an embodiment, the method comprises the forming of a cathode contact metallization common to the first active photonic stack and to the second active photonic stack.

According to an embodiment, the first active photonic stack is bonded to the second active photonic stack by direct metal-to-metal bonding or by direct dielectric-to-dielectric bonding or by direct semiconductor-to-semiconductor bonding.

According to an embodiment, the method comprises, before the bonding of the first active photonic stack to the second active photonic stack, a step of deposition of a metal layer on top of and in contact with the upper surface of the second active photonic stack.

According to an embodiment, on bonding of the first active photonic stack to the second active photonic stack, said metal layer extends continuously over the entire surface of the second active photonic stack.

According to an embodiment, before the bonding of the first active photonic stack to the second active photonic stack, the metal layer is locally removed by etching to define a plurality of separate electrodes.

According to an embodiment, the photonic device comprises a visible sensor and an infrared sensor stacked to each other, the visible sensor being formed inside and on top of a semiconductor layer and the infrared sensor being formed inside and on top of an active infrared detector stack.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1A:
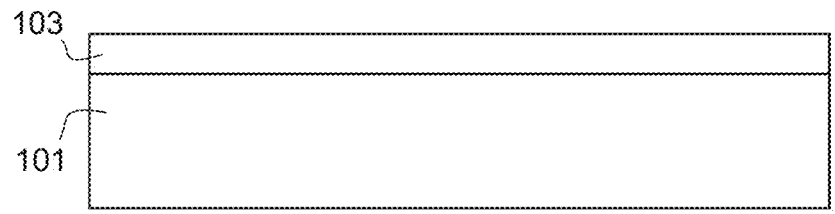
FIGS. 1A, 1B, 1C, 1D, 1E, 1F, 1G, 1H, 1I, 1J, and 1K are cross-section views illustrating steps of an example of an optoelectronic device manufacturing method according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the light emitting and/or receiving photonic components and of the integrated circuits for controlling the described devices has not been detailed, the detailed forming of these elements being within the abilities of those skilled in the art based on the functional indications provided in the present description. Further, the various possible applications of the described devices have not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

According to an aspect of an embodiment, it is provided, to form an optoelectronic device comprising unit light emitting and/or receiving photonic components also called pixels, monolithically integrated on an integrated control circuit, for example, of CMOS type, to implement the steps of:

a) forming a photonic device comprising a plurality of photonic components formed inside and on top of a stack of one or a plurality of semiconductor layers coating a first substrate;

b) forming an electronic device comprising a plurality of electronic components, for example, MOS transistors, formed inside and on top of a semiconductor layer coating a second substrate;

c) after steps a) and b), bonding the electronic device to the upper surface of the photonic device by direct bonding, and then removing the second substrate;

d) after step c), forming, on the upper surface side of the electronic device, electric connection metallizations contacting the electronic components and the photonic components.

Preferably, after step a) and before step c), a metal layer is deposited on the upper surface of the photonic device, this metal layer continuously extending over the entire surface of the first substrate. After step c), a step of etching, from the upper surface of the electronic device, of a plurality of trenches vertically extending through the electronic device and the metal layer is then provided, the trenches delimiting in the metal layer a plurality of electrodes electrically insulated from one another.

Examples of implementation of such methods will be described hereafter. These examples are non-limiting and various alterations will occur to those skilled in the art based on the indications of the present disclosure.

FIGS. 1A, 1B, 1C, 1D, 1E, 1F, 1G, 1H, 1I, 1J, and 1K are cross-section views illustrating steps of an example of an optoelectronic device manufacturing method according to an embodiment.

FIG. 1A illustrates an initial structure for the forming of the photonic device, comprising a substrate 101 coated, on its upper surface side, with a photonic stack 103. Photonic stack 103 may comprise one or a plurality of stacked semiconductor layers, for example, one or a plurality of layers made of III-V-type semiconductor materials. Stack 103 is for example an active photodiode stack, for example sensitive in infrared or near infrared, or an active photodiode stack sensitive in the visible range. As an example, stack 103 comprises a non-intentionally doped indium phosphide (InP) layer, an indium gallium arsenide (InGaAs) absorption layer, for example, lightly N-type doped, and a relatively heavily N-type doped indium phosphide (InP) layer (not detailed in the drawing). As a variant, stack 103 may be an active light-emitting diode (LED) stack.

Substrate 101 is for example made of silicon. As an example, stack 103 is first formed by epitaxy on a growth substrate, for example, made of indium phosphide, and then transferred and bonded to substrate 101, for example, by direct bonding, the growth substrate then being removed or thinned. In practice, substrate 101 may have lateral dimensions greater than those of the growth substrate. In this case, a plurality of dies of stack 103 (not detailed in the drawings) may be transferred and bonded onto the same substrate 101, to reconstruct a stack 103 of greater lateral dimensions, for example such as described in the article entitled "High-definition Visible-SWIR InGaAs Image Sensor using Cu—Cu Bonding of III-V to Silicon Wafer" of S. Manda et al. (IEDM 2019). After the bonding of the dies, a leveling of the surface with a dielectric layer, for example, an oxide, may be provided to obtain a planar surface.

Figure 1B:
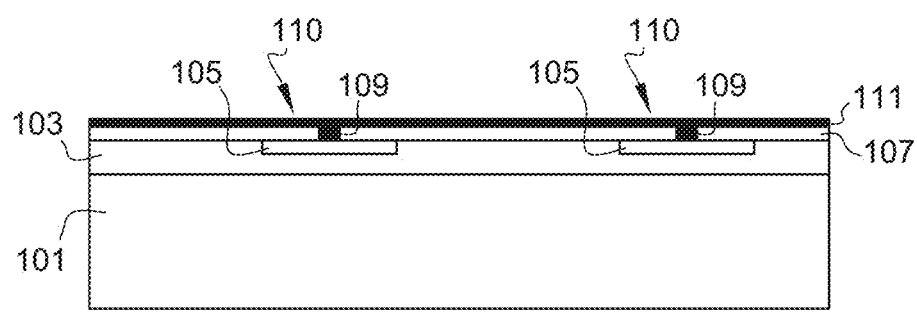

FIG. 1B illustrates the structure obtained at the end of steps of forming of elementary photonic components in stack 103. In the shown example, the elementary photonic components are photosensitive diodes 110. For each photosensitive diode 110, a P-type doped local region 105 is formed in an upper N-type region of stack 103, region 105 defining an anode region of the photosensitive diode. For this purpose, a dielectric layer 107, for example, made of silicon nitride or of silicon oxide, is first deposited on the upper surface of stack 103. Local openings are then formed in dielectric layer 107 in front of future anode regions 105. Regions 105 are then P-type doped, by diffusion or implantation of P-type dopant elements, for example, zinc (Zn) or beryllium (Be), in front of the openings. Anneals for activating the dopant elements may then be implemented. Contacting metallizations 109, for example made of tungsten, of copper, of aluminum, or of an alloy of one or a plurality of these materials, are then formed in the openings, for example by a damascene-type method, to obtain a planar upper surface (in other words, metallizations 109 are flush with the level of the upper surface of dielectric layer 107). Each metallization 109 may comprise a peripheral metal diffusion barrier layer, for example, a titanium/titanium nitride stack or a tantalum/tantalum nitride stack. Each metallization 109 is in contact, by its lower surface, with the upper surface of the underlying anode region 105. As a variant, the local doping of regions 105 may be performed by implantation through dielectric layer 107, before the forming of the openings in dielectric layer 107. This enables to avoid possible degradations of the upper surface of stack 103 linked to the implantation method.

FIG. 1B further illustrates a step of deposition of a metal layer 111, for example, made of titanium, on the upper surface of the photonic device thus obtained. Layer 111 for example extends continuously and with a substantially uniform thickness over the entire surface of substrate 101. In this example, metal layer 111 is in contact, by its lower surface, with the upper surface of dielectric layer 107, and with the upper surface of metallizations 109. Thus, at this stage, the anode contact metallizations 109 of the diodes are all connected to one another via metal layer 111.

Figure 1C:
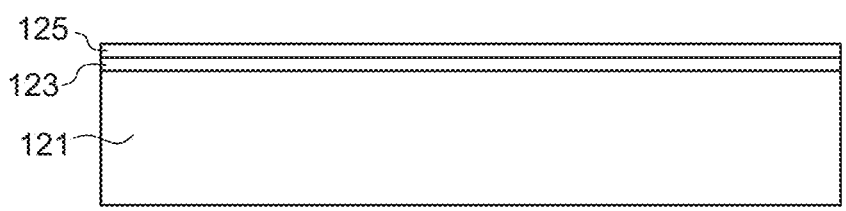

FIG. 1C illustrate an initial structure for the forming of the electronic device, for example, in CMOS technology. The structure of FIG. 1C is a structure of silicon on insulator type, also called SOI structure, comprising a substrate 121, for example, made of silicon, a dielectric layer 123, for example, made of silicon oxide, on top of and in contact with the upper surface of substrate 121, and a semiconductor layer 125, for example, made of silicon, on top of and in contact with the upper surface of dielectric layer 123. At this stage, dielectric and semiconductor layers 123 and 125 for example each extend continuously and with a substantially uniform thickness over the entire upper surface of substrate 121. Substrate 121 for example has substantially the same shape and the same lateral dimensions as the substrate 101 of FIGS. 1A and 1B. As an example, substrate 121 has a generally circular shape with a diameter in the order of 200 mm or in the order of 300 mm.

Figure 1D:
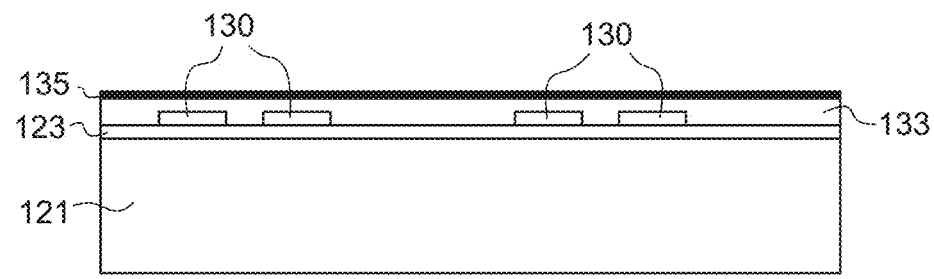

FIG. 1D illustrates the structure obtained at the end of steps of forming of electronic components 130, for example, MOS transistors, inside and on top of semiconductor layer 125. The forming of components 130 may comprise one or a plurality of steps of local implantation of dopant elements in semiconductor layer 125, as well as one or a plurality of anneals of activation of the dopant elements. The forming of components 130 may further comprise steps of deposition and etching of a gate insulator layer and of one or a plurality of conductive gate layers of MOS transistors. For simplification, the different elements of components 130 have not been detailed in the drawings.

As an example, semiconductor layer 125 may be etched across its entire thickness around components 130, to laterally insulate components 130 from one another. In the shown example, after the forming of components 130, a passivating insulating layer 133, for example, made of silicon oxide, is deposited over the entire upper surface of the device, for example, across a thickness greater than that of components 130. A step of planarization of the upper surface of insulating layer 133 may further be implemented.

FIG. 1D further illustrates a step of deposition of a metal layer 135, for example made of the same material as layer 111 (FIG. 1B) for example, of titanium, on the upper surface of the electronic device thus obtained. Layer 135 for example extends continuously and with a substantially uniform thickness over the entire surface of substrate 121. In this example, metal layer 135 is in contact, by its lower surface, with the upper surface of dielectric layer 133.

Figure 1E:
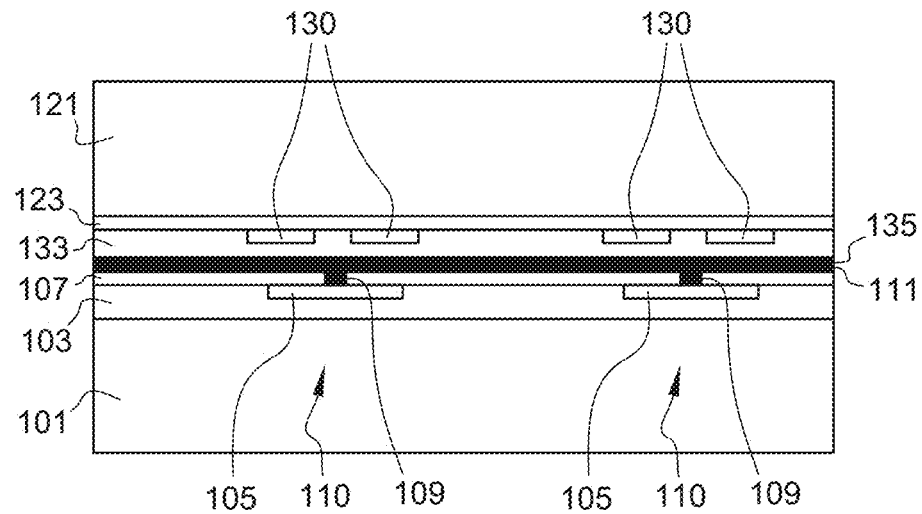

FIG. 1E illustrates a subsequent step of transfer and of bonding of the electronic device of FIG. 1D onto the upper surface of the photonic device of FIG. 1B. In FIG. 1E, the electronic device is flipped with respect to the orientation of FIG. 1D. The orientation of the photonic device is however unchanged with respect to the orientation of FIG. 1B.

The electronic device is bonded to the photonic device by direct bonding (that is, with no addition of material), also called molecular bonding, of the lower surface of metal layer 135 to the upper surface of metal layer 111.

Figure 1F:
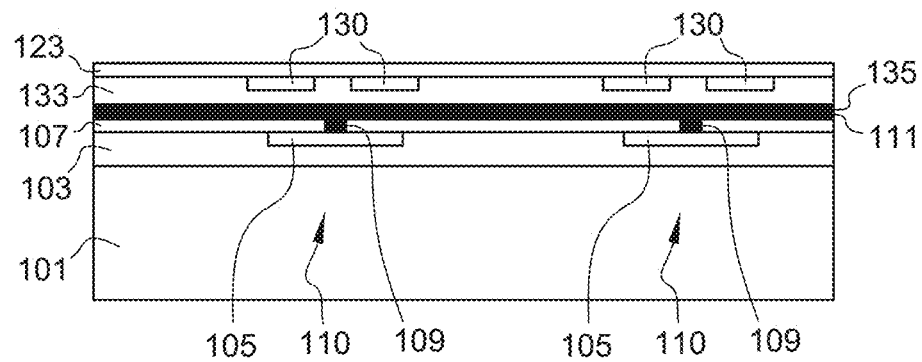

FIG. 1F illustrates a subsequent step of removal of semiconductor substrate 121 from the electronic device, for example by grinding and then full plate chemical etching (for example, an etching selective over the material of dielectric layer 123), to clear the access to the upper surface of dielectric layer 123.

Figure 1G:
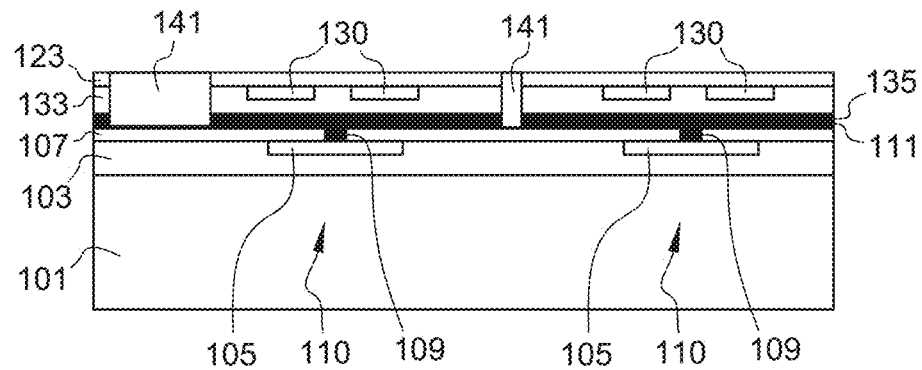

FIG. 1G illustrates the structure obtained at the end of a subsequent step of etching of vertical trenches 141 from the upper surface of dielectric layer 123. Trenches 141 cross dielectric layers 123 and 133 and metal layers 135 and 111 and emerge into dielectric layer 107 or onto the upper surface of dielectric layer 107. Trenches 141 are then filled with an insulating material, for example silicon oxide, after which a step of planarization of the upper surface of the assembly may be implemented, for example, by chemical-mechanical polishing (CMP). As a variant, a CMP stop layer, not shown, may be deposited on the upper surface of dielectric layer 123 prior to the etching of trenches 141. In another variant, the dielectric material filling trenches 141 (for example, silicon nitride) may be a material different from that of dielectric layer 123 (for example, silicon oxide), layer 123 then being used as a CMP stop layer.

Insulating trenches 141 delimit a plurality of separate metallizations, that is, electrically insulated from one another, in the stack formed by metal layers 111 and 135. As an example, trenches 141 laterally delimit one specific metallization per photosensitive diode of the photonic device, said metallization, also called anode metallization, being connected to the anode contacting metallization 109 of the diode.

The trenches extend between the electronic components 130 of the electronic device.

Figure 1H:
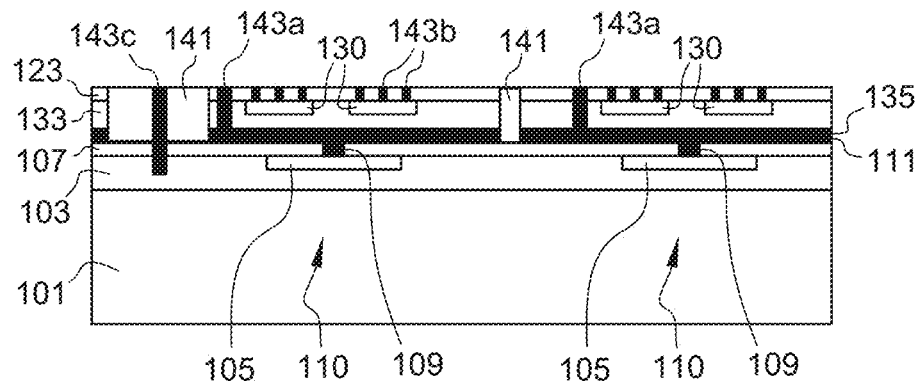

FIG. 1H illustrates the structure obtained at the end of subsequent steps of forming of contacting conductive vias, from the upper surface of the structure of FIG. 1G. During this step, contacting conductive vias are formed on the different photonic and electronic components of the assembly. In the shown example, a conductive via 143a vertically extending through insulating layers 123 and 133 individually comes into contact, by its upper surface, with each anode metallization of the device. Further, for each electronic component 130, one or a plurality of conductive vias 143b extending vertically through insulating layer 123 come into contact with contact regions of the electronic component, for example, gate, drain, and/or source regions in the case of MOS transistors. In the shown example, one or a plurality of conductive vias 143c extending vertically through an insulating trench 141 and through the underlying dielectric layer 107 come into contact with a cathode semiconductor region of stack 103. Although not detailed in the drawings, a lateral insulation layer, for example, made of silicon oxide, may coat the lateral walls of vias 143c to avoid short-circuiting the different layers of stack 103. The electric contact is then taken at the bottom of the via, inside or on top of an N-type semiconductor layer of stack 103, forming the cathode region of the photosensitive components. The lateral insulation layer is for example deposited by a conformal deposition method, and then opened at the bottom of the vias by vertical anisotropic etching.

As an example, a cathode contact common to all the photosensitive diodes of the device may be formed at the periphery of the device. As an example, the common cathode contact couples electronic components of the device to an N-type doped layer of stack 103.

Figure 1I:
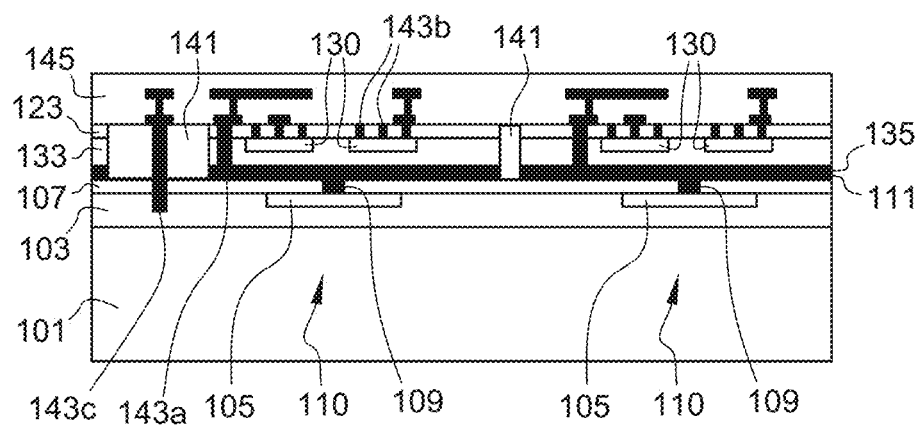

FIG. 1I illustrates the structure obtained at the end of subsequent steps of forming of an interconnection stack 145 on top of and in contact with the upper surface of the structure of FIG. 1I. Interconnection stack 145 comprises an alternation of insulating and conductive levels defining interconnection and routing tracks and vias of the different components of the device.

Figure 1J:
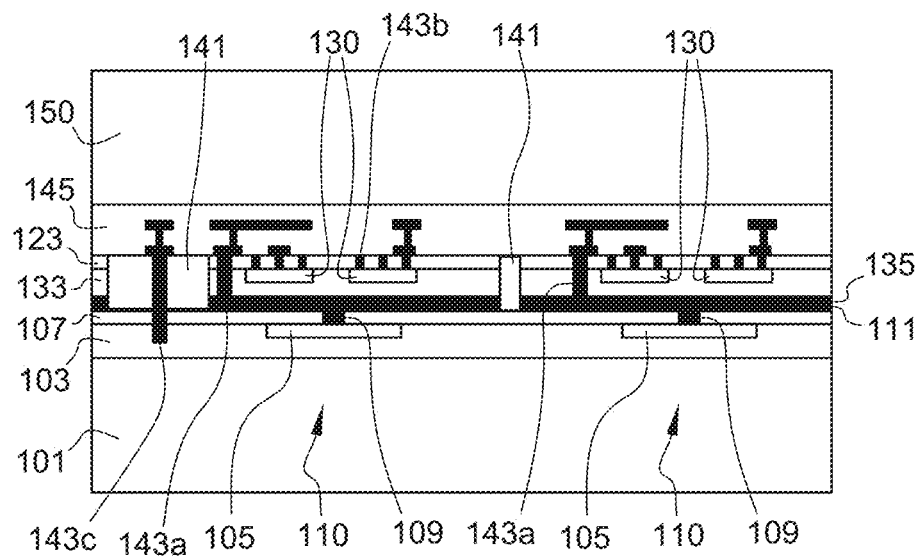

FIG. 1J illustrates a step of bonding of a support substrate or handle 150, for example, a silicon substrate, to the upper surface of interconnection stack 145. Support substrate 150 may be bonded by direct bonding or by any other adapted bonding method, for example, by bonding by means of an adhesive polymer.

Figure 1K:
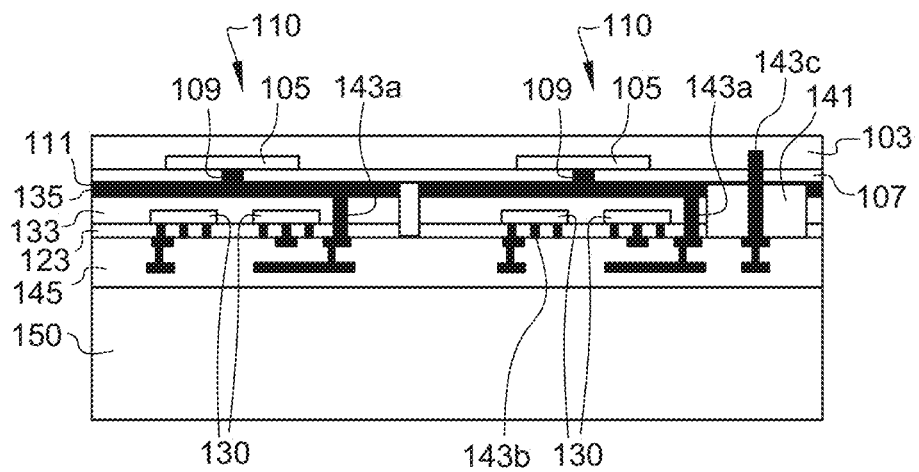

FIG. 1K illustrates the optoelectronic device obtained after a step of removal of substrate 101 from the photonic device, for example, by grinding and then full plate chemical etching, to clear the access to the surface of stack 103 opposite to dielectric layer 107. In FIG. 1K, the device is flipped with respect to the orientation of FIG. 1J.

After this step, electric power supply connection pads may be formed on the upper surface side of the device. For this purpose, stack 103 may be locally etched across its entire thickness, to expose the upper surface of metal layer 111. Electric power supply connection pads in contact, by their lower surface, with the upper surface of metal layer 111, are then formed in the openings thus formed. As a variant, metal layers 111 and 135 may be removed during the etching, the contact being then directly taken on the upper surface of vias 143a.

An advantage of the method described in relation with FIGS. 1A to 1K is linked to the fact that, during the step of bonding of the electronic device to the photonic device, metal layers 111 and 135 each extend over the entire surface of the assembly. The performed bonding thus is a full plate direct bonding. Such a bonding has the advantage of being less constraining, particularly in terms of design and of preparation of the surfaces to be bonded, than a direct hybrid bonding, that is, a bonding of a hybrid metal/oxide surface to another hybrid metal/oxide surface. This for example allows a better tolerance to a misalignment of the dies of stack 103 with respect to the electronic device.

The method described hereabove further enables to optimize the performance of photonic devices by doing away with steps of etching of deep trenches through photonic stack 103, and by performing the insulation of the pixels on the back side (upper surface in the orientation of FIGS. 1F and 1G), after bonding of the electronic device.

The above-described method further enables to limit the thermal budget seen by the photonic components since the electronic components (for example, MOS transistors) are formed before the bonding of the electronic device to the photonic device. In particular, the steps of implantation and of activation of the dopant elements, which may imply anneals at high temperatures, for example, in the order of 1,000° C. or more, are implemented before the bonding. After the bonding, there only remain steps at relatively low temperature, for example, lower than 450° C., for the forming of the electric interconnects.

As a variant, rather than forming electronic components 130 (for example, MOS transistors) before the assembly of the electronic device and of the photonic device (FIG. 1E), electronic components 130 may be formed after the bonding of the electronic device to the photonic device and the removal of substrate 121, according to a sequential 3D-type method, for example, such as described in patent application US2007/0018075, with as a specificity the presence of a full plate metal layer 111, 135 under semiconductor layer 125, and the forming of insulating trenches extending through said metal layer. In this variant, one will preferably use, to form electronic components 130, methods having a limited thermal budget, for example, so-called low-temperature methods, that is, only comprising steps at temperatures lower than 600° C., and preferably lower than 450° C.

Figure 2A:
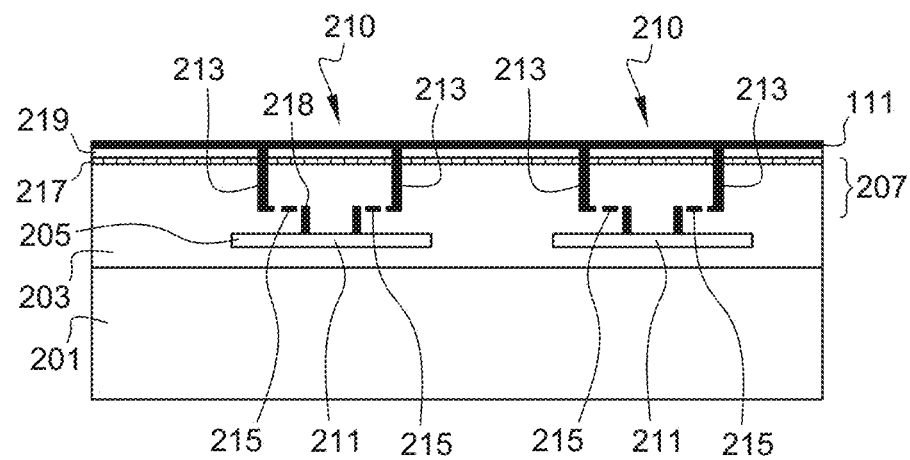
FIGS. 2A and 2B are cross-section views illustrating steps of another example of an optoelectronic device manufacturing method according to an embodiment.
Figure 2B:
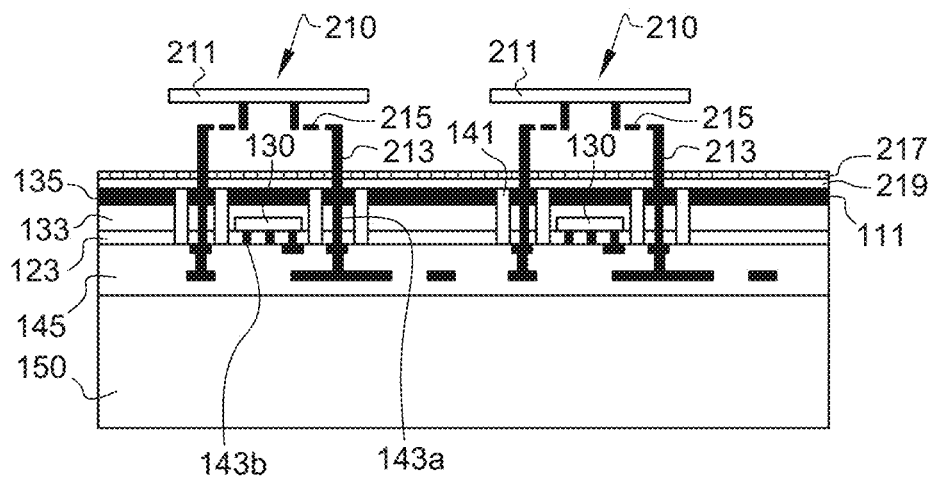

FIGS. 2A and 2B are cross-section views illustrating another example of a method of manufacturing an optoelectronic device according to an embodiment.

The method of FIGS. 2A and 2B differs from the method described in relation with FIGS. 1A to 1K mainly in that, in the example of FIGS. 2A and 2B, the photonic device is an infrared sensor based on microbolometers.

FIG. 2A illustrates the photonic device after the deposition of metal bonding layer 111 and before the bonding of the electronic device.

The photonic device of FIG. 2A may be formed by any known method of manufacturing an infrared sensor based on microbolometers, for example, from an SOI-type structure comprising a semiconductor support substrate 201, for example, made of silicon, an insulating layer 203, for example made of silicon oxide, arranged on top of and in contact with the upper surface of substrate 201, and a semiconductor layer 205, for example, made of silicon, arranged on top of and in contact with the upper surface of semiconductor layer 205.

In the shown example, each microbolometer 210 comprises a membrane 211 formed by a portion of semiconductor layer 205. Each microbolometer 210 further comprises metal pillars 213 and 218 and arms 215 for mechanically suspending membrane 211. Suspension arms 215 are formed of a stack of dielectric and metal layers and ensure with pillars 213 and 218 a function of electric connection to contacting regions of the membrane. Metal pillars 213, 218 and mechanical suspension arms 215 are formed in a stack 207 of insulating layers and of metal layers arranged on top of and in contact with the upper surface of semiconductor layer 205. Metal pillars 218 are in contact, by their lower surface, with the upper surface of membrane 211 and, by their upper surface, with the lower surface of a metal layer of suspension arms 215. Metal pillars 213 are in contact, by their lower surface, with the upper surface of a metal layer of arms 215. The insulating layers of stack 207 are for example made of silicon oxide.

In the shown example, stack 207 is coated with an etch stop layer 217 made of a dielectric material, for example, of alumina ($Al_2O_3$) or of aluminum nitride (AlN). Layer 217 is for example arranged on top of and in contact with the upper surface of stack 207. In this example, layer 217 is itself coated with an insulating layer 219, for example, made of silicon oxide. Layer 219 is for example arranged on top of and in contact with the upper surface of etch stop layer 217. In this example, the metal support pillars 213 of each microbolometer extend through layers 217 and 219 and emerge onto the upper surface side of insulating layer 219.

In this example, metal bonding layer 111, for example, made of titanium, extends continuously and with a substantially uniform thickness over the entire upper surface of the photonic device. More particularly, in this example, metal bonding layer 111 is in contact, by its upper surface, with the upper surface of insulating layer 219 and with the upper surface of metal support pillars 213. Thus, at this stage, the metal pillars 213 of the microbolometers are all connected to one another via metal layer 111.

The rest of the method is similar to what has been described hereabove in relation with FIGS. 1A to 1K, by substituting to the photonic device based on photodiodes of FIG. 1B the photonic device based on photodetectors of FIG. 2A.

In this example, insulating trenches 141 delimit a plurality of separate metallizations in the stack formed by metal layers 111 and 135, each metallization being for example connected to a single metal support pillar 213. Trenches 141 further enable to define, under each membrane, metal areas non-connected to the pillars, having the function of reflecting the received radiation to improve the performance of the microbolometers.

Conductive vias 143 comprise vias 143a respectively coming into contact with the different metal pillars 213 (via the portions of metal layers 111 and 135 delimited by trenches 141), and vias 143b coming into contact with contact regions of electronic components 130.

After the bonding of support handle 150 to the surface of interconnection stack 145 opposite to the photonic device (corresponding to the step of FIG. 1J), substrate 201 is removed to expose the insulating layer 203 of the initial SOI structure. In this example, as well as in the previously-described examples, the buried silicon oxide layer 203 of the initial SOI substrate enables to ease the removal of the silicon support substrate.

Insulating layer 203 as well as the insulating layers of stack 207 are then removed by a selective etching method to only keep the membranes 211, the metal pillars 213 and 218, and the suspension arms 215 of the microbolometers. Membranes 211 are then suspended on the pillars and the metal support arms. The etching implemented to release the microbolometers is preferably a chemical vapor etching, for example, an etching based on hydrofluoric acid. In this example, layer 217 is used as an etch stop layer, particularly to avoid consuming the silicon oxide of insulating layer 219 and of trenches 141 and to protect the electronic components of the device.

Figure 3A:
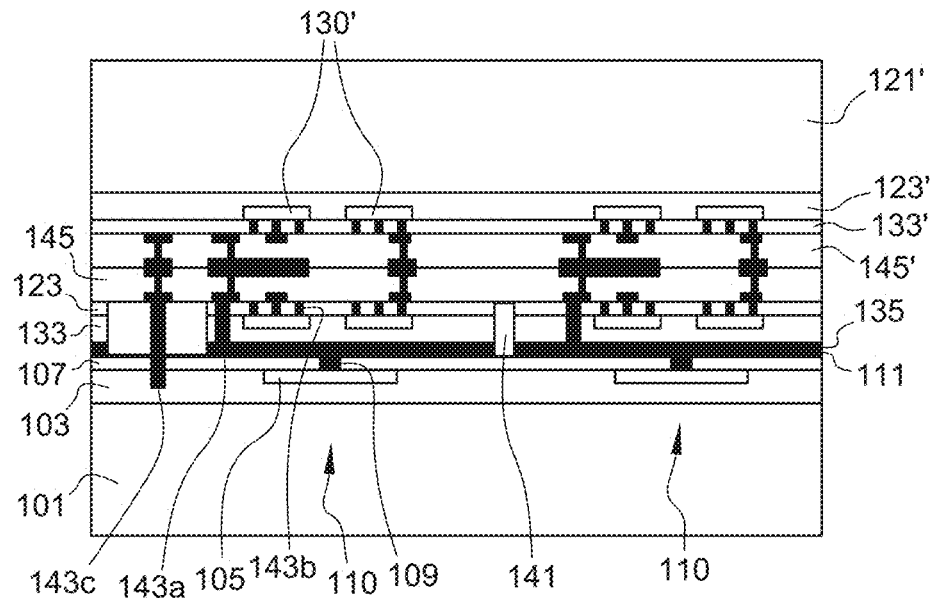
FIGS. 3A and 3B are cross-section views illustrating steps of another example of an optoelectronic device manufacturing method according to an embodiment.
Figure 3B:
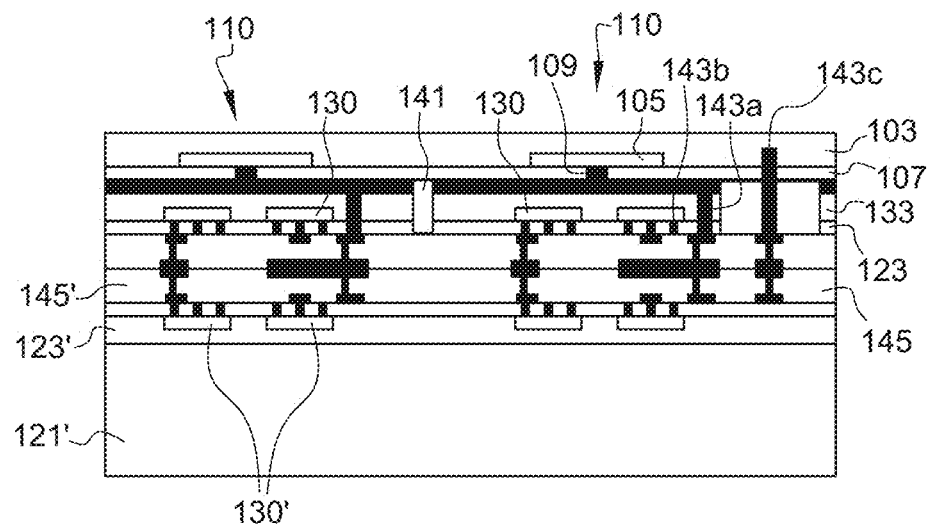

FIGS. 3A and 3B are cross-section views illustrating steps of another example of an optoelectronic device manufacturing method according to an embodiment.

The method of FIGS. 3A and 3B differs from the method described in relation with FIGS. 1A to 1K mainly in that, in the example of FIGS. 3A and 3B, a second electronic device, for example, formed in CMOS technology, is bonded and electrically connected to the electronic device comprising components 130. For this purpose, after the steps of FIGS. 1A to 1I, instead of bonding a support handle 150 to the upper surface of the interconnection stack 145 such as described in relation with FIG. 1J, the second electronic device is bonded to the upper surface of stack 145.

This step is illustrated in FIG. 3A. The second electronic device is for example similar to the first electronic device. In the shown example, the second electronic device is formed from an SOI structure comprising a substrate 121' coated with an insulating layer 123', itself coated with a semiconductor layer having components 130', for example, MOS transistors, formed inside and on top of it. The second electronic device further comprises, on the side of the semiconductor layer opposite to substrate 121', an interconnection stack 145' having a connection surface (lower surface in the orientation of FIG. 3A) symmetrical with respect to the connection surface (upper surface in the orientation of FIG. 3A) of the interconnection stack 145 of the first electronic device.

The second electronic device is bonded and electrically connected to the first electronic device, for example, by direct hybrid bonding of the surface of interconnection stack 145' opposite to substrate 121' (that is, the lower surface of stack 145' in the orientation of FIG. 3A) onto the surface of stack 145 opposite to substrate 101 (that is, the upper surface of stack 145 in the orientation of FIG. 3A). The bonding may be a direct hybrid bonding of copper oxide type.

Once the bonding has been performed, substrate 101 may be removed, as described in relation with FIG. 1K. This step is illustrated in FIG. 3B.

An advantage of the method of FIGS. 3A and 3B is that it enables to increase the electronic functionalities of the device, without increasing its surface area. The variant of FIGS. 3A and 3B may be combined with the variant of FIGS. 2A and 2B.

FIGS. 4A, 4B, 4C, 4D, 4E, 4F, and 4G are cross-section views illustrating steps of another example of a method of manufacturing an optoelectronic device according to an embodiment.

The method of FIGS. 4A to 4G differs from the method of FIGS. 1A to 1K mainly in that, in the example of FIGS. 4A to 4G, the photonic device integrates different functions, for example, a light emission function and a light reception function. As an example, the photonic device integrates light-emitting diodes (LEDs) and photosensitive diodes.

Figure 4A:
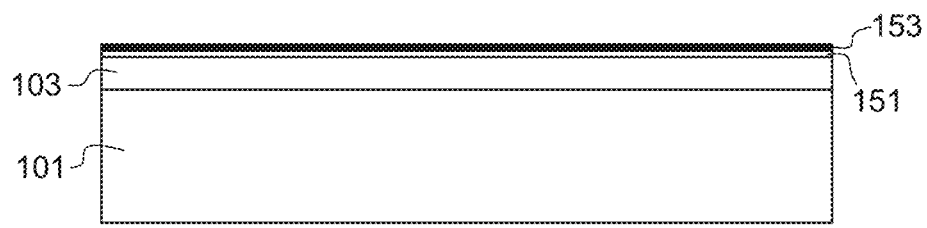
FIGS. 4A, 4B, 4C, 4D, 4E, 4F, and 4G are cross-section views illustrating steps of another example of an optoelectronic device manufacturing method according to an embodiment.

FIG. 4A schematically shows the structure obtained at the end of steps of forming of an active photosensitive diode stack 103 on the upper surface of a substrate 101. The structure comprising stack 103 and substrate 101 is for example similar to what has been described hereabove in relation with FIG. 1A. Preferably, the order of the layers of stack 103 is reversed with respect to the example of FIG. 1A. For this purpose, the layers of stack 103 may be epitaxially grown in the reverse order of what has been described in the example of FIG. 1A, or the stack may be flipped and bonded by gluing to a support substrate.

FIG. 4A further illustrates a step of deposition of a dielectric layer 151, for example, made of silicon oxide or of silicon nitride, on top of and in contact with the upper surface of active photosensitive diode stack 103. In this example, dielectric layer 151 extends continuously and with a substantially uniform thickness over the entire upper surface of stack 103.

FIG. 4A further illustrates a step of deposition of a metal layer 153, for example, made of titanium, on top of and in contact with the upper surface of dielectric layer 151. In this example, metal layer 153 extends continuously and with a substantially uniform thickness over the entire upper surface of stack 103.

Figure 4B:
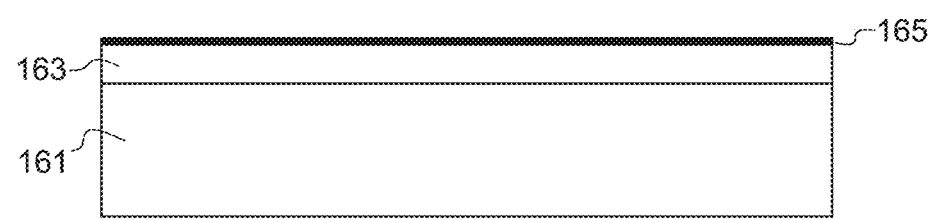

FIG. 4B schematically illustrates the structure obtained at the end of steps of forming of an active LED stack 163 on the upper surface of a substrate 161.

Stack 163 preferably is a stack of inorganic semiconductor layers. Stack 163 for example comprises one or a plurality of layers made of a III-V-type semiconductor material. Stack 163 is for example an active LED stack adapted to emitting visible light, for example, mainly blue light. As an example, stack 163 is an active gallium nitride (GaN) LED stack. As an example, stack 163 comprises, in the order from the upper surface of substrate 161 (not detailed in the drawing), an N-type doped semiconductor layer, forming a cathode layer of the LED stack, an active layer, and a P-type doped semiconductor layer, forming an anode layer of the LED stack. The active layer is for example a multiple quantum well stack. Substrate 161 is for example made of silicon.

FIG. 4B further illustrates a step of deposition of a metal layer 165 on top of and in contact with the upper surface of active LED stack 163. Layer 165 is for example made of the same material as layer 153, for example made of titanium. At this stage, metal layer 165 extends continuously and with a substantially uniform thickness over the entire upper surface of active LED stack 163.

At this stage, each of the layers of active photosensitive diode stack 103 extends, for example, continuously and with a substantially uniform thickness, over the entire upper surface of substrate 101. Further, each of the layers of active LED stack 163 for example extends substantially continuously and with a substantially uniform thickness over the entire upper surface of substrate 161. Substrates 101 and 161 for example have substantially the same lateral dimensions.

Figure 4C:
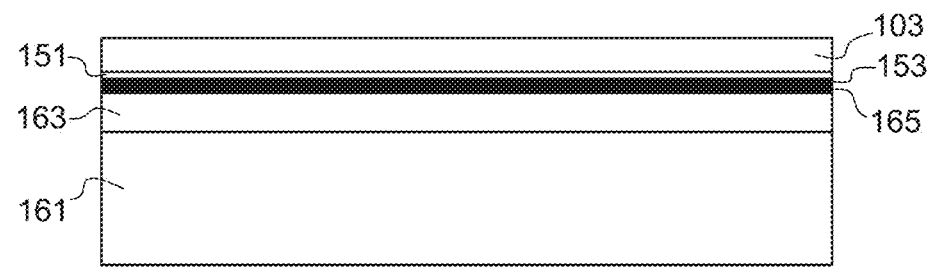

FIG. 4C illustrates the structure obtained at the end of a step of transfer and of bonding of active photosensitive diode stack 103 onto active LED stack 163, and then of removal of substrate 101. During this step, active photosensitive diode stack 103 is transferred onto active LED stack 163, by using substrate 101 as a support handle. In FIG. 4C, the structure comprising substrate 101 and stack 103 is flipped with respect to the orientation of FIG. 4A. Stack 103 is then bonded to stack 163. In this example, stack 103 is bonded by full plate direct bonding of the lower surface (in the orientation of FIG. 4C, corresponding to the upper surface in the orientation of FIG. 4A) of metal layer 153, to the upper surface (in the orientation of FIG. 4C, corresponding to the upper surface in the orientation of FIG. 4B) of metal layer 165. Substrate 101 is then removed, for example, by grinding and/or chemical etching, to clear the access to the upper surface of stack 103.

Figure 4D:
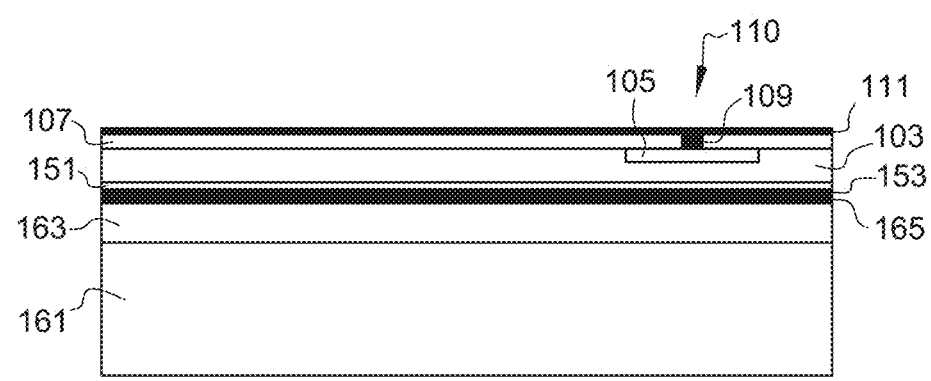

FIG. 4D illustrates the structure obtained at the end of steps of forming of elementary photosensitive diodes in stack 103, identical or similar to what has been described hereabove in relation with FIG. 1B.

FIG. 4D further illustrates a step of deposition of a metal layer 111, for example made of titanium, on the upper surface of the photonic device thus obtained. Layer 111 for example extends continuously and with a substantially uniform thickness over the entire surface of substrate 161. In this example, metal layer 111 is in contact, by its lower surface, with the upper surface of dielectric layer 107, and with the upper surface of metallizations 109. Thus, at this stage, the anode contact metallizations 109 of the diodes are all connected to one another via metal layer 111.

The rest of the method is similar to what has been described hereabove in relation with FIGS. 1C to 1J.

Figure 4E:
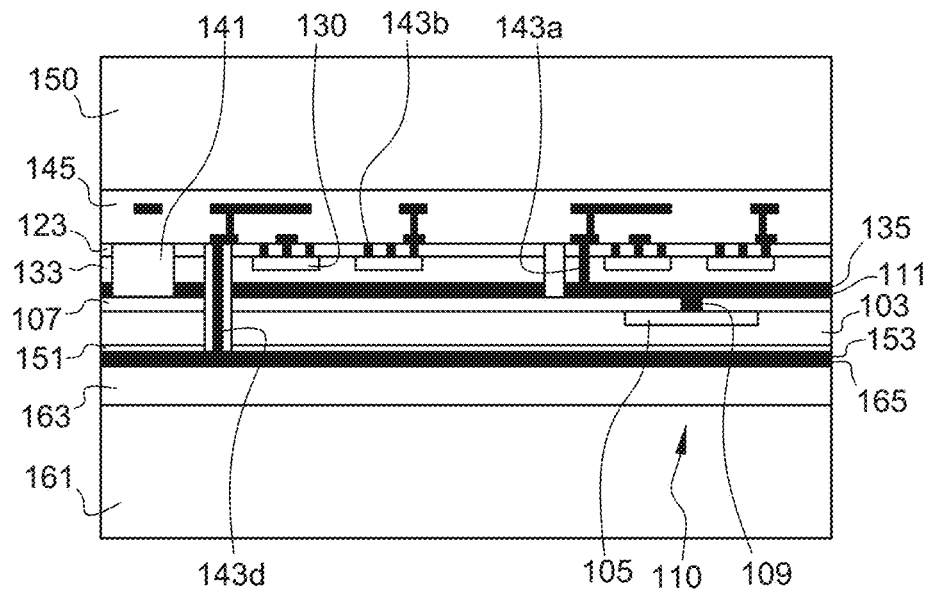

FIG. 4E illustrates the structure obtained after the bonding of support handle 150 to the surface of the interconnection stack 145 of the electronic device opposite to the photonic device (that is, the upper surface of interconnection stack 145 in the orientation of FIG. 4E). It should be noted that in FIG. 4E, the via 143c (FIG. 1J) contacting the semiconductor cathode region of stack 103 has not been shown. In FIG. 4E, a conductive via 143d, laterally insulated, vertically extending through layers 123, 133, 135, 111, 107, 103, and 151, and contacting metal layer 153 has further been shown.

Figure 4F:
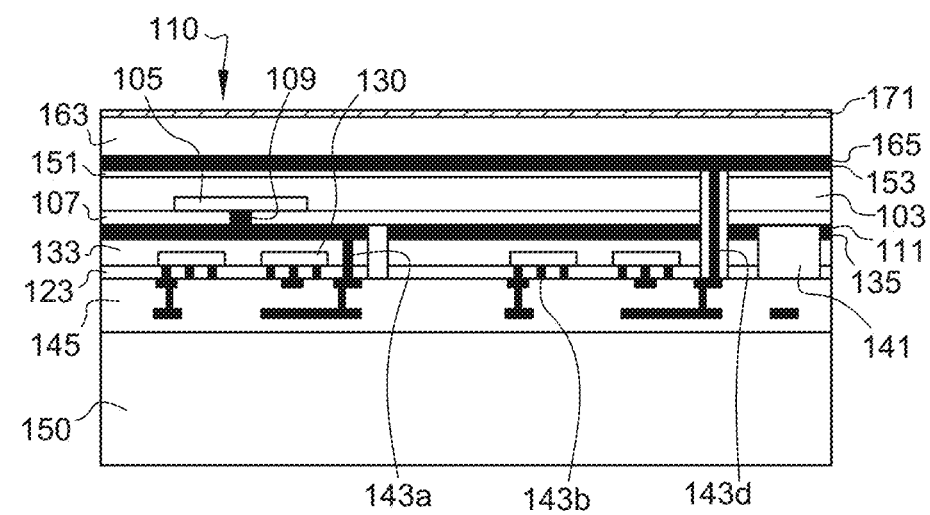

FIG. 4F illustrates a step of removal of substrate 161, to expose the surface of active LED stack 163 opposite to metal layer 165, followed by a step of deposition of a conductive layer 171 on top of and in contact with the surface of active LED stack 163 opposite to metal layer 165. In FIG. 4F, the assembly is flipped with respect to the orientation of FIG. 4E. Thus, in this drawing, conductive layer 171 is arranged on the upper surface side of active LED stack 163.

Layer 171 is for example made of a transparent conductive material, for example, indium tin oxide (ITO), or of a metal sufficiently thin to be transparent, for example, silver. At this stage, metal layer 171 for example extends continuously and with a substantially uniform thickness over the entire upper surface of active LED stack 163.

Figure 4G:
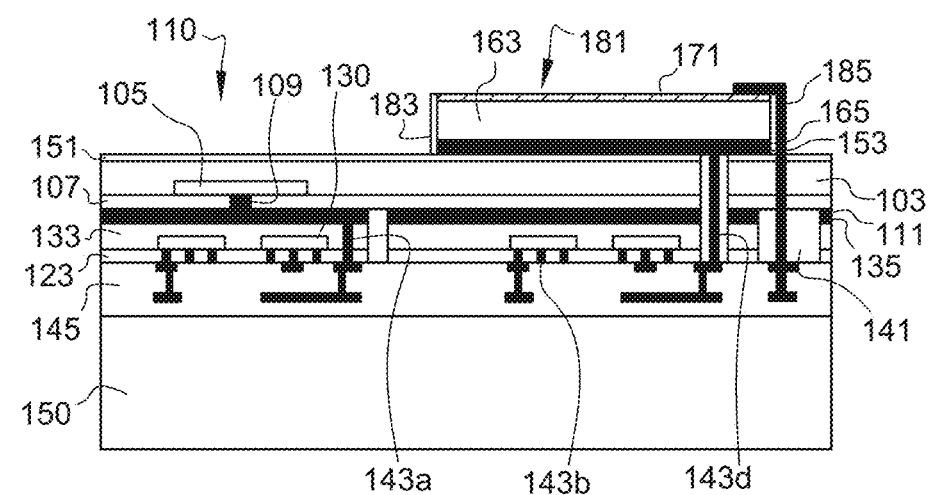

FIG. 4G illustrates the structure obtained at the end of a step of local etching of the stack formed by metal layer 171, active LED stack 163, metal layer 165, and metal layer 153. During this step, only are kept tiles 181 of active LED stack 163, respectively corresponding to the different LEDs of the device. The portion of the stack of metal layers 165 and 153 located under each LED 181 forms a first electrode, for example, an anode electrode, of the LED, and is electrically connected to a metallization of the interconnection stack 145 of the integrated control circuit by means of a via 143d. The portion of conductive layer 171 located on each LED 181 forms a second electrode, for example, a cathode electrode, of the LED.

FIG. 4G further illustrates a step of passivation of the sides of LEDs 181. During this step, a layer 183 of an insulating material, for example, silicon oxide or silicon nitride, is conformally deposited on the upper surface side of the structure, that is, on the upper surface of insulating layer 151 and of upper conductive layer 171, and on the sides of LEDs 181 and of conductive layers 171, 165, and 153. A vertical anisotropic etch step may then be implemented to remove the horizontal portions of layer 183, by keeping the vertical portions of layer 183, coating the sides of LEDs 161 and of LEDs 161 and of conductive layers 171, 165, and 153.

FIG. 4G further illustrates a step of forming of a metallization 185 connecting the upper surface of each LED 181 to a metallization of interconnection stack 145. In this example, metallization 185 extends along the side of LED 181, through layers 151, 103, and 107, and through an insulating trench 141. In the shown example, metallization 185 is in contact, laterally, with active photodiode stack 103. Thus, in this example, metallization 185 forms a contact metallization common to the LEDs and to the photodiodes, for example a common cathode metallization. As a variant (not shown), metallization 185 may be laterally insulated from active photodiode stack 103.

The method of FIGS. 4A to 4G may be extended to the forming of an optoelectronic device integrating more than two different photonic functions.

Figure 5:
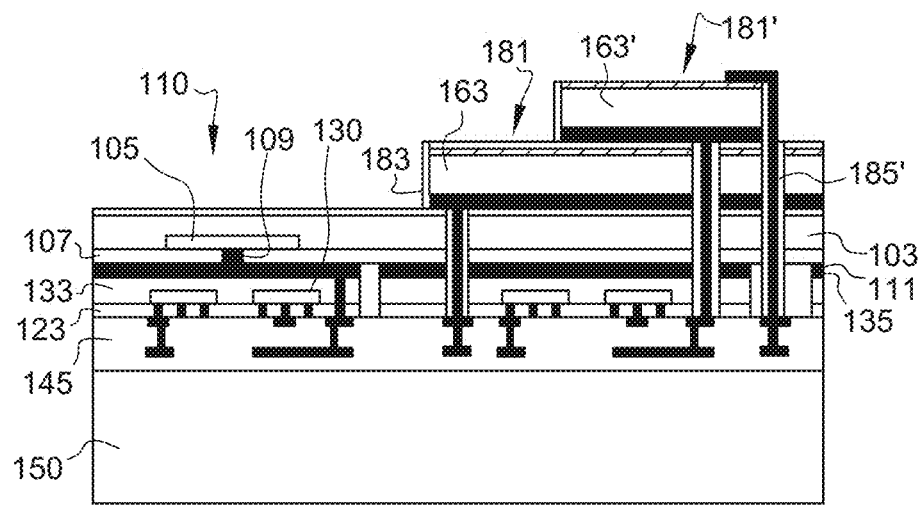
FIG. 5 is a cross-section view illustrating another example of an optoelectronic device manufacturing method according to an embodiment.

FIG. 5 schematically shows an example of an optoelectronic device where the photonic device integrates light-emitting diodes 181 adapted to emitting at a first wavelength, light-emitting diodes 181' adapted to emitting at a second wavelength, and photosensitive diodes 110.

For this purpose, an initial photonic structure comprising an active photosensitive diode stack 103 coated, on the side of a surface, with a first active LED stack 163 is formed, active LED stack 163 being itself coated with a second active LED stack 163'.

In the final device, as illustrated in FIG. 5, LEDs 181 correspond to portions of active LED stack 163 in front of which active LED stack 163' has been removed, and LEDs 181' correspond to portions of active LED stack 163' topping portions of active LED stack 163. In FIG. 5, the metallization 185 contacting the upper surface of LEDs 181 is not shown. A metallization 185' coupling the upper surface of LEDs 181' to interconnection stack 145 has however been shown.

It should be noted that the variants of FIGS. 4A to 4G and 5 may be combined with the variants of FIGS. 2A and 2B or 3A and 3B.

Figure 6A:
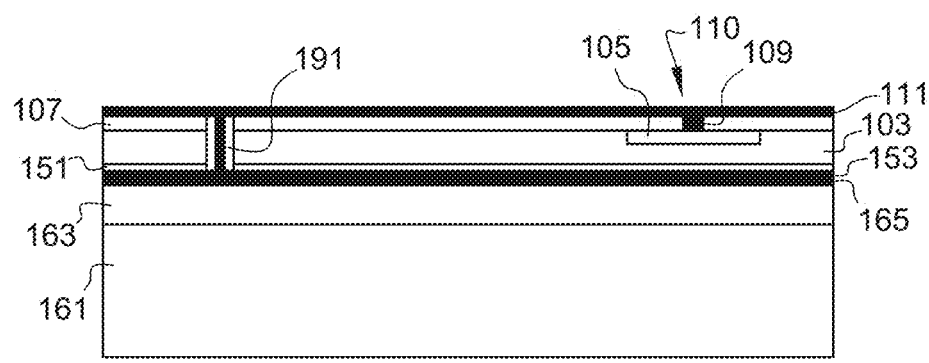
FIGS. 6A and 6B are cross-section views illustrating steps of another example of an optoelectronic device manufacturing method according to an embodiment.
Figure 6B:
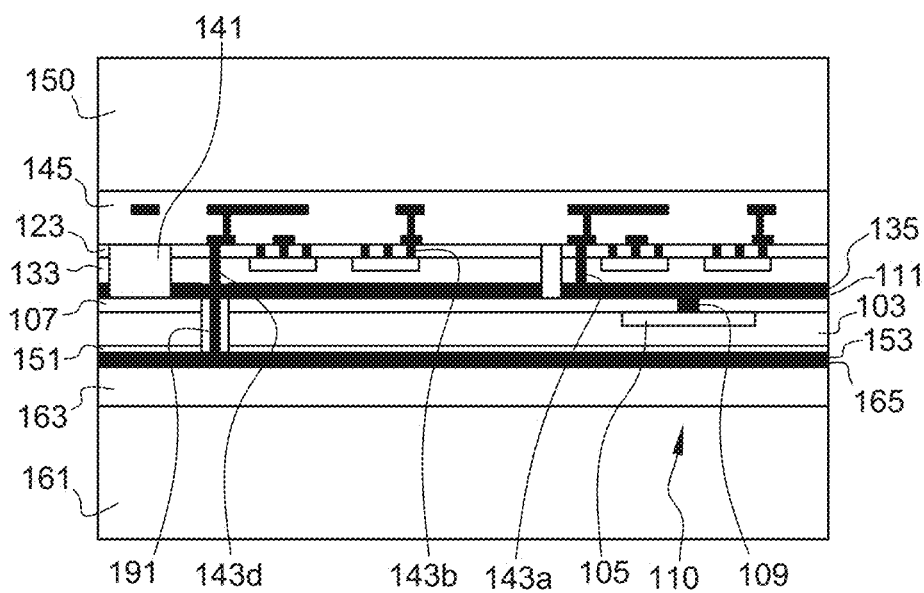

FIGS. 6A and 6B are cross-section views illustrating steps of an alternative implementation of the method of FIGS. 4A to 4G.

The initial steps of the method are identical or similar to what has been described in relation with FIGS. 4A to 4D, with the difference that, before depositing metal bonding layer 111, a conductive via 191, laterally insulated, vertically extending through dielectric layers 107 and 151 and through active stack 103, is formed. Via 191 is in contact, by its lower surface, with the upper surface of metal layer 153. As an example, a via 191 is formed in front of each location of a LED 181 of the device. Metal layer 111 is then deposited on the upper surface of the structure. At this stage, each via 191 is in contact, by its upper surface, with the lower surface of metal layer 111.

The rest of the method is similar to what has been previously described, with the difference that, in this example, via 143d does not cross active photosensitive diode stack 103 but emerges onto the upper surface of metal layer 135.

FIG. 6B shows the intermediate structure obtained after the bonding of support handle 150 to the upper surface of interconnection stack 145. The rest of the method is similar to what has been described in relation with FIGS. 4A to 4G. The connection on electrode 153 of each LED 181 is thus formed by means of via 143d and of via 191. It should be noted that in practice and conversely to what is shown in the drawing, vias 191 and 143d are not necessarily vertically aligned, the latter being electrically connected to each other via metal layers 111 and 135.

An advantage of the variant of FIGS. 6A and 6B, linked to the sequential forming of the electric connection on active LED stack 163, is to enable to independently form vias 143d and 191, and thus, possibly, to vertically misalign them. This enables to limit the impact of a misalignment due to the successive bondings between the pixels of the two functions (photosensitive diodes and LEDs in this example) of the photonic device on the one hand, and the electronic components on the other hand. This variant particularly enables to increase the density of photonic and/or electronic function per surface area unit.

FIGS. 7A, 7B, 7C, and 7D are cross-section views illustrating steps of another variant of the method of manufacturing an optoelectronic device described in relation with FIGS. 4A to 4G.

The method of FIGS. 7A to 7D differs from the method of FIGS. 4A to 4G mainly by the nature of the bonding between active photosensitive diode stack 103 and active LED stack 163. In this example, the bonding between active photosensitive diode stack 103 and active LED stack 163 is a direct full plate dielectric-to-dielectric bonding, for example, a direct oxide-to-oxide bonding.

Figure 7A:
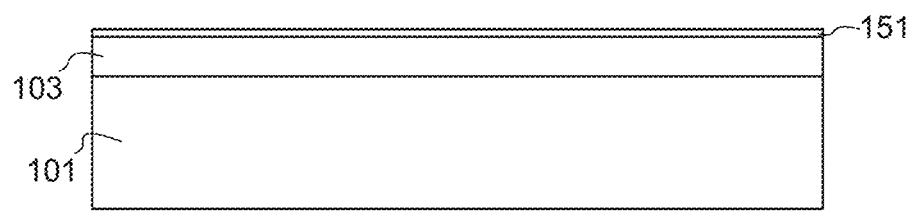
FIGS. 7A, 7B, 7C, and 7D are cross-section views illustrating steps of another example of an optoelectronic device manufacturing method according to an embodiment.

FIG. 7A schematically shows the structure obtained at the end of steps of forming of an active photosensitive diode stack 103 on the upper surface of a substrate 101. The structure comprising stack 103 and substrate 101 is for example similar to what has been described hereabove in relation with FIG. 1A.

FIG. 7A further illustrates a step of deposition of a dielectric layer 151, for example, made of silicon oxide, on top of and in contact with the upper surface of active photosensitive diode stack 103. In this example, dielectric layer 151 extends continuously and with a substantially uniform thickness over the entire upper surface of stack 103.

Figure 7B:
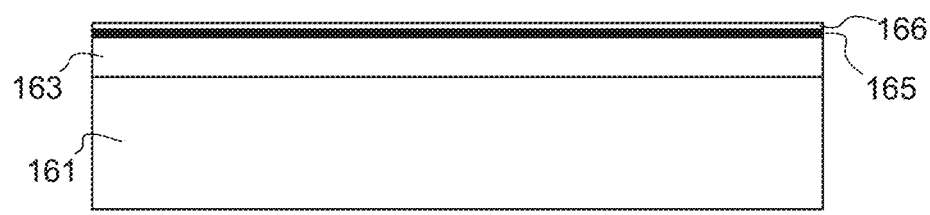

FIG. 7B schematically illustrates the structure obtained at the end of steps of forming of an active LED stack 163 on the upper surface of a substrate 161.

Stack 163 is for example identical or similar to what has been described hereabove in relation with FIG. 4B.

FIG. 7B further illustrates a step of deposition of a metal layer 165 on top of and in contact with the upper surface of active LED stack 163. At this stage, metal layer 165 extends continuously and with a substantially uniform thickness over the entire upper surface of active LED stack 163. It should be noted that in this example, metal layer 165 does not have a molecular bonding function, which releases a constraint as to the selection of the materials that can be used to form this layer. As an example, layer 165 is made of titanium, of aluminum, of copper, of tungsten, or of an alloy of one or a plurality of these materials. As a variant, layer 165 may be made of any other adapted conductive material, for example, of a doped semiconductor material, for example, silicon or germanium.

FIG. 7B further illustrates a step of deposition of a dielectric layer 166, for example, made of the same material as dielectric layer 151, on top of and in contact with the upper surface of metal layer 165. At this stage, dielectric layer 166 for example extends continuously and with a substantially uniform thickness over the entire upper surface of active LED stack 163.

Figure 7C:
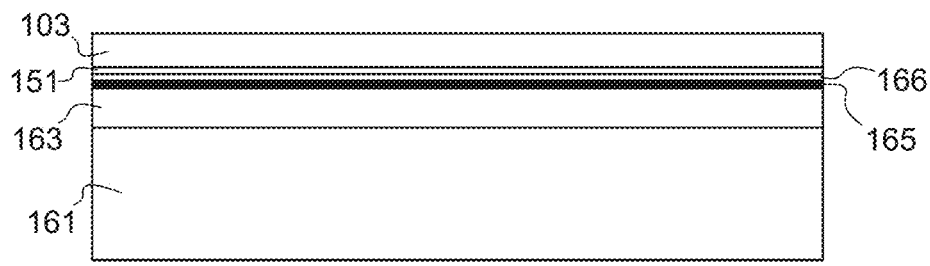

FIG. 7C illustrates the structure obtained at the end of a step of transfer and of bonding of active photosensitive diode stack 103 onto active LED stack 163, and then of removal of substrate 101. During this step, active photosensitive diode stack 103 is transferred onto active LED stack 163, by using substrate 101 as a support handle. In FIG. 7C, the structure comprising substrate 101 and stack 103 is flipped with respect to the orientation of FIG. 7A. Stack 103 is then bonded to stack 163. In This example, stack 103 is bonded by direct full plate bonding of the lower surface (in the orientation of FIG. 7C, corresponding to the upper surface in the orientation of FIG. 7A) of dielectric layer 151, to the upper surface (in the orientation of FIG. 7C, corresponding to the upper surface in the orientation of FIG. 7B) of dielectric layer 166. Substrate 101 is then removed to clear the access to the upper surface of stack 103.

Figure 7D:
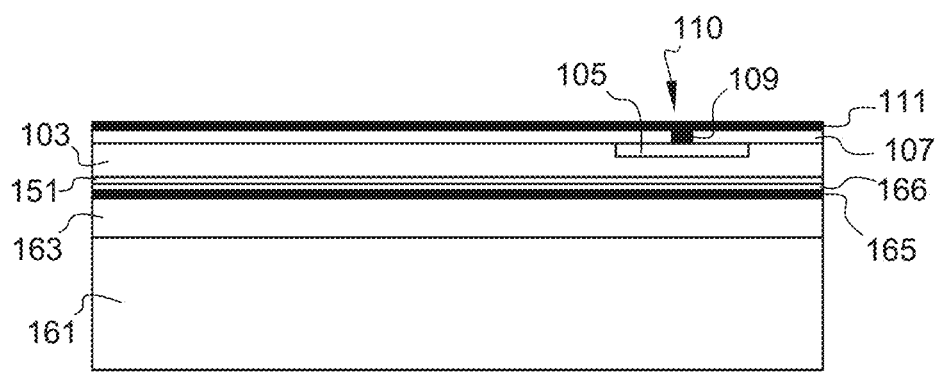

FIG. 7D illustrates the structure obtained at the end of the steps of forming of elementary photosensitive diodes 110 in stack 103, and then of deposition of metal layer 111 on the upper surface of the photonic device.

The next steps are identical or similar to what has been previously described.

As a variant, dielectric layers 151 and 166 may be replaced with layers of a semiconductor material, for example, undoped to have a relatively high electric resistivity, for example, undoped silicon or germanium. The bonding performed between active photosensitive diode stack 103 and active LED stack 163 then is a full plate semiconductor-to-semiconductor bonding.

It should be noted that the variant of FIGS. 7A to 7D and the variant of FIGS. 6A and 6B may be combined. Further, these variants, whether they are taken alone or in combination, may be combined with the variants of FIGS. 2A and 2B or 3A and 3B.

Figure 8A:
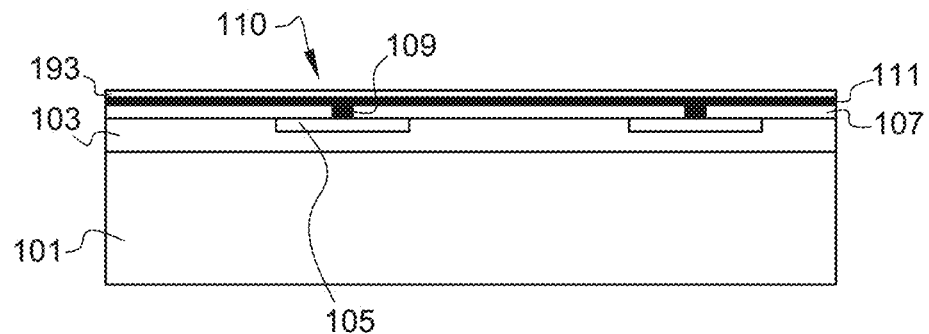
FIGS. 8A, 8B and 8C are cross-section views illustrating steps of another example of an optoelectronic device manufacturing method according to an embodiment.
Figure 8B:
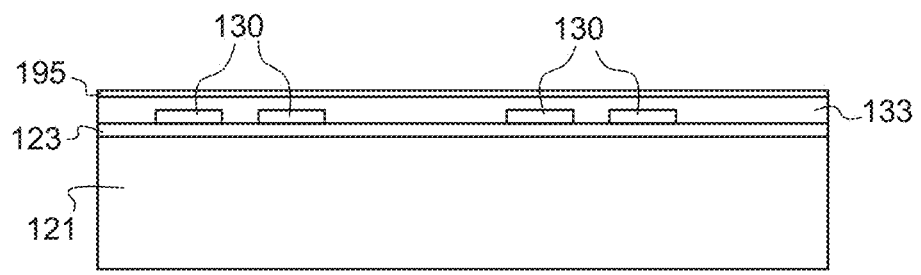
Figure 8C:
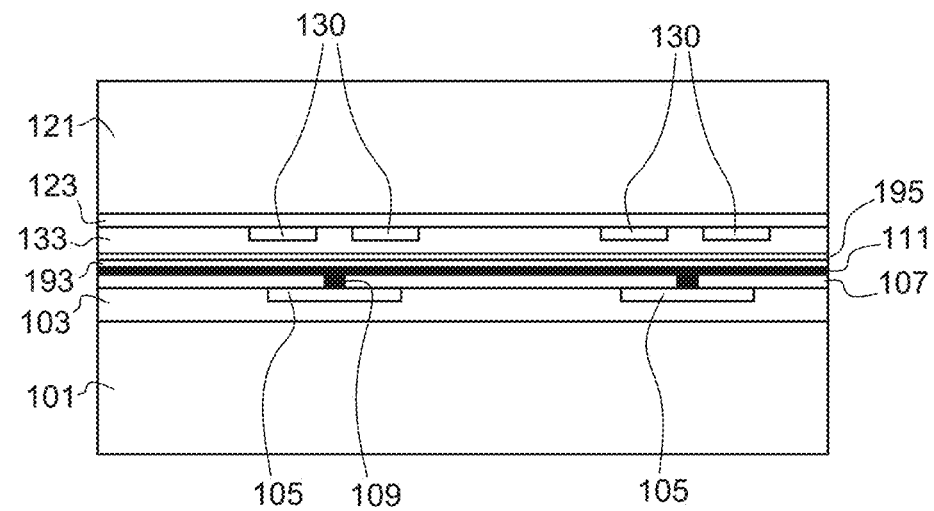

FIGS. 8A, 8B, and 8C are cross-section views illustrating steps of another variant of the optoelectronic device manufacturing method described in relation with FIGS. 1A to 1K.

The method of FIGS. 8A to 8C differs from the method of FIGS. 1A to 1K mainly by the nature of the bonding between the photonic device and the electronic device. In this example, the bonding between the photonic device and the electronic device is a direct full plate dielectric-to-dielectric bonding, for example, a direct oxide-to-oxide bonding.

FIG. 8A illustrates a photonic device structure identical or similar to the structure of FIG. 1B, but where a dielectric layer 193, for example, made of silicon oxide, has been deposited on top of and in contact with the upper surface of metal layer 111. Dielectric layer 193 extends for example continuously and with a substantially uniform thickness over the entire upper surface of metal layer 111. In this example, metal layer 111 may be made of titanium, of aluminum, of copper, of tungsten, or of an alloy of one or a plurality of these materials.

FIG. 8B illustrates an electronic device structure identical or similar to the structure of FIG. 1D, but where upper metal layer 135 is replaced with a dielectric layer 195, for example, made of the same material as dielectric layer 193, for example, of silicon oxide.

FIG. 8C illustrates a subsequent step of transfer and of bonding of the electronic device of FIG. 8B onto the upper surface of the photonic device of FIG. 8A. In FIG. 8C, the electronic device is flipped with respect to the orientation of FIG. 8B. The orientation of the photonic device is however unchanged with respect to the orientation of FIG. 8A.

The electronic device is bonded to the photonic device by direct full plate bonding of the lower surface of dielectric layer 195 to the upper surface of dielectric layer 193.

The rest of the method is identical or similar to what has been described hereabove in relation with FIGS. 1F to 1K.

As a variant, dielectric layers 193 and 195 may be replaced with layers of a semiconductor material, for example, undoped to have a relatively high electric resistivity, for example, undoped silicon or germanium. The bonding performed between the photonic device and the electronic device thus is a direct full plate semiconductor-to-semiconductor bonding.

It should be noted that the variant of FIGS. 8A to 8C may be combined with the variants of FIGS. 2A and 2B, 3A and 3B, 4A to 4G, 5, 6A and 6B, and 7A to 7D.

FIGS. 9A, 9B, 9C and 9D are cross-section views illustrating steps of an alternative embodiment of the method of FIGS. 7A to 7D.

The method of FIGS. 9A to 9D differs from the method of FIGS. 7A to 7D mainly in that, in the example of FIGS. 9A to 9D, metal layer 165 is structured (patterned) to define the LED electrodes, before the bonding of active photosensitive diode stack 103 to active LED stack 163.

Figure 9A:
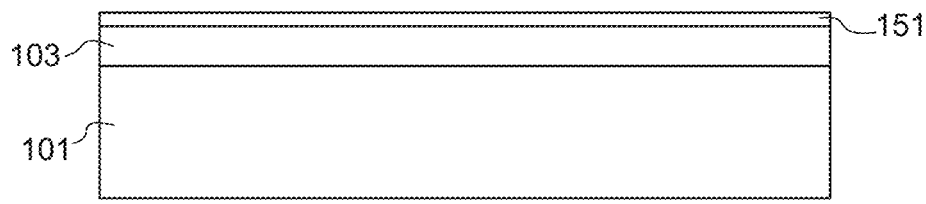
FIGS. 9A, 9B, 9C, and 9D are cross-section views illustrating steps of another example of an optoelectronic device manufacturing method according to an embodiment.

FIG. 9A schematically illustrates the structure obtained at the end of steps of forming of an active photosensitive diode stack 103 on the upper surface of a substrate 101, followed by a step of deposition of a dielectric layer 151, for example made of silicon oxide, on top of and in contact with the upper surface of active photosensitive diode stack 103. The structure of FIG. 9A is for example similar to what has been described hereabove in relation with FIG. 7A.

Figure 9B:
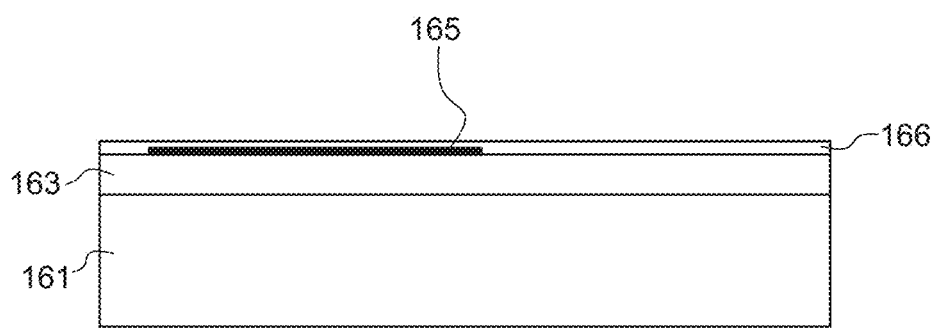

FIG. 9B schematically illustrates the structure obtained at the end of steps of forming of an active LED stack 163 on the upper surface of a substrate 161. Stack 163 is for example identical or similar to what has been described hereabove in relation with FIG. 7B.

FIG. 9B further illustrates a step of deposition and then of local etching of a metal layer 165 on top of and in contact with the upper surface of active LED stack 163. Metal layer 165 is first deposited continuously and with a substantially uniform thickness over the entire upper surface of active LED stack 163. A step of local etching is then implemented to define in layer 165 a plurality of separate electrodes each corresponding, in the final device, to a lower electrode (in the orientation of FIG. 4G) of a LED of the photonic device. Outside of said electrodes, metal layer 165 is removed across its entire thickness to expose the upper surface of active photosensitive diode stack 103.

FIG. 9B further illustrates a step of deposition of a dielectric layer 166, for example, made of the same material as dielectric layer 151, for example, of silicon oxide, on the upper surface of the structure obtained after the step of structuring of metal layer 165. Dielectric layer 166 may be deposited with a thickness greater than the thickness of metal layer 165, and then planarized. At the end of the planarization step, dielectric layer 166 continuously extends over the entire upper surface of substrate 161.

Figure 9C:
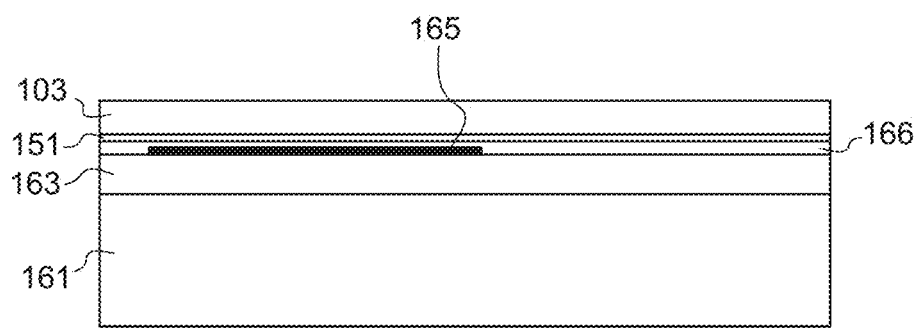

FIG. 9C illustrates the structure obtained at the end of a step of transfer and of bonding of active photosensitive diode stack 103 onto active LED stack 163, and then of removal of substrate 101. During this step, active photosensitive diode stack 103 is transferred onto active LED stack 163, by using substrate 101 as a support handle. In this example, stack 102 is bonded by full plate direct bonding of the lower surface (in the orientation of FIG. 9C, corresponding to the upper surface in the orientation of FIG. 9A) of dielectric layer 151, to the upper surface (in the orientation of FIG. 4C, corresponding to the upper surface in the orientation of FIG. 9B) of dielectric layer 166. Substrate 101 is then removed to clear the access to the upper surface of stack 103.

Figure 9D:
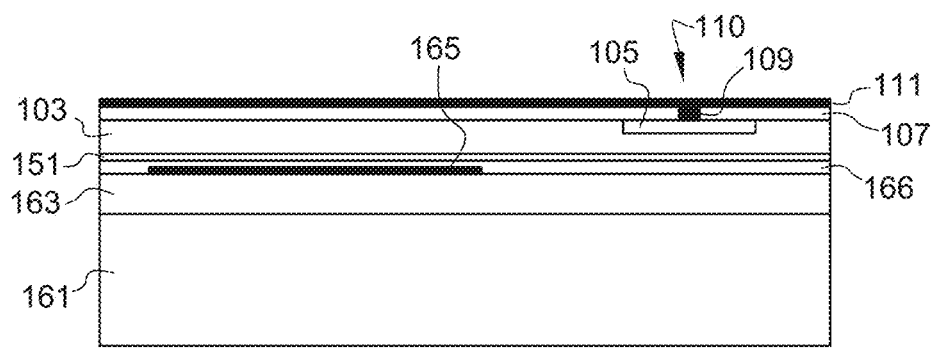

FIG. 9D illustrates the structure obtained at the end of the steps of forming of elementary photosensitive diodes 110 in stack 103, and then of deposition of metal layer 111 on the upper surface of the photonic device.

The next steps are identical or similar to what has been previously described.

In this variant, since metal layer 165 has been removed outside of the locations of the LEDs of the device, and if active LED stack 163 is sufficiently transparent in the wavelength of sensitivity of active photosensitive diode stack 103, stack 163 cannot be etched at the end of the method. In other words, the step of structuring of active LED stack 163 described in relation with FIG. 4G may be omitted. This enables to simplify the manufacturing method.

As a variant, dielectric layers 151 and 166 may be replaced with layers of a semiconductor material, for example, undoped to have a relatively high electric resistivity, for example, undoped silicon or germanium. The bonding performed between active photosensitive diode stack 103 and active LED stack 163 is thus a full plate semiconductor-to-semiconductor bonding.

Like the variant of FIGS. 7A to 7D, the variant of FIGS. 9A to 9D may be combined with the other variants disclosed hereabove.

FIGS. 10A, 10B, 10C, and 10D are cross-section views illustrating steps of another example of an optoelectronic device manufacturing method according to an embodiment.

In this example, the photonic device comprises a visible detector, for example, based on silicon, and an infrared detector, for example, based on III-V-type semiconductor materials, for example, based on InGaAs, the visible detector and the infrared detector being stacked.

Figure 10A:
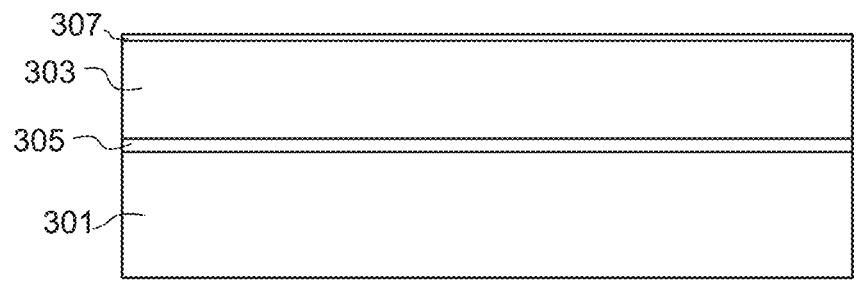
FIGS. 10A, 10B, 10C, and 10D are cross-section views illustrating steps of another example of an optoelectronic device manufacturing method according to an embodiment.

FIG. 10A very schematically illustrates a first structure comprising an active infrared detector stack 303, for example based on InGaAs, arranged on a support substrate 301, for example, made of silicon. In the shown example, a dielectric layer 305, for example, made of silicon oxide, forms an interface between substrate 301 and stack 303. Further, in this example, a dielectric layer 307, for example, made of silicon oxide, coats the upper surface of stack 303.

Figure 10B:
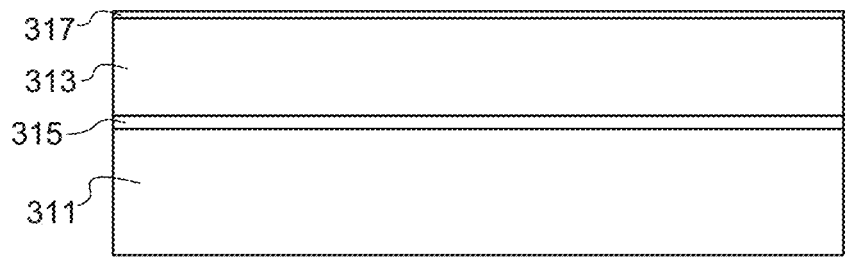

FIG. 10B very schematically illustrates a second structure comprising a visible sensor comprising a plurality of visible light detection pixels (not detailed in the drawing) formed inside and on top of a semiconductor layer 313, for example, made of silicon, arranged on a support substrate 311, for example, made of silicon. In the shown example, a dielectric layer 315, for example, made of silicon oxide, forms an interface between substrate 311 and layer 313. Stack 311-315-313 is for example a SOI substrate. Further, in this example, a dielectric layer 317, for example, made of silicon oxide, coats the upper surface of semiconductor layer 313.

Figure 10C:
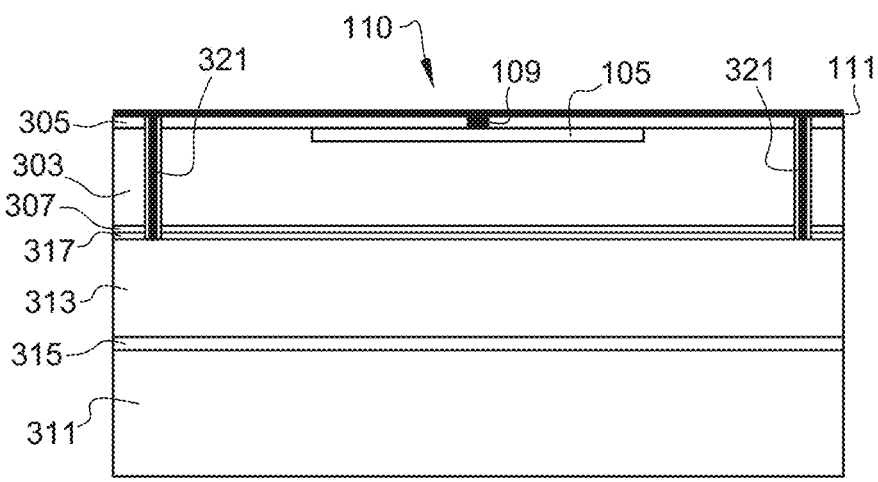

FIG. 10C illustrates the structure obtained at the end of a step of transfer and bonding of the structure of FIG. 10A onto the structure of FIG. 10B, and then of removal of substrate 301. In this example, the structure of FIG. 10A is bonded by full plate direct bonding of the lower surface (in the orientation of FIG. 10C, corresponding to the upper surface in the orientation of FIG. 10A) of dielectric structure 307 onto the upper surface (in the orientation of FIG. 10C, corresponding to the upper surface in the orientation of FIG. 10B) of layer 317.

Substrate 301 is then removed to expose the upper surface (in the orientation of FIG. 10C) of dielectric layer 305. As a variant, layer 305 is not present in the initial stack of FIG. 10A, and is deposited only after the removal of substrate 301, at the step of FIG. 10C.

In the shown example, insulated conductive vias 321, vertically crossing dielectric layer 305, active stack 303, and dielectric layers 307 and 317, are then formed to take electric contacts on the pixels of the visible sensor.

FIG. 10C further illustrates steps of forming of photosensitive diodes 110 in active infrared detector stack 303. For each photosensitive diode 110, a local P-type region 105 is for example formed in an N-type upper layer of stack 303, region 105 defining an anode region of the photosensitive diode.

The rest of the method is similar to what has been previously described.

Figure 10D:
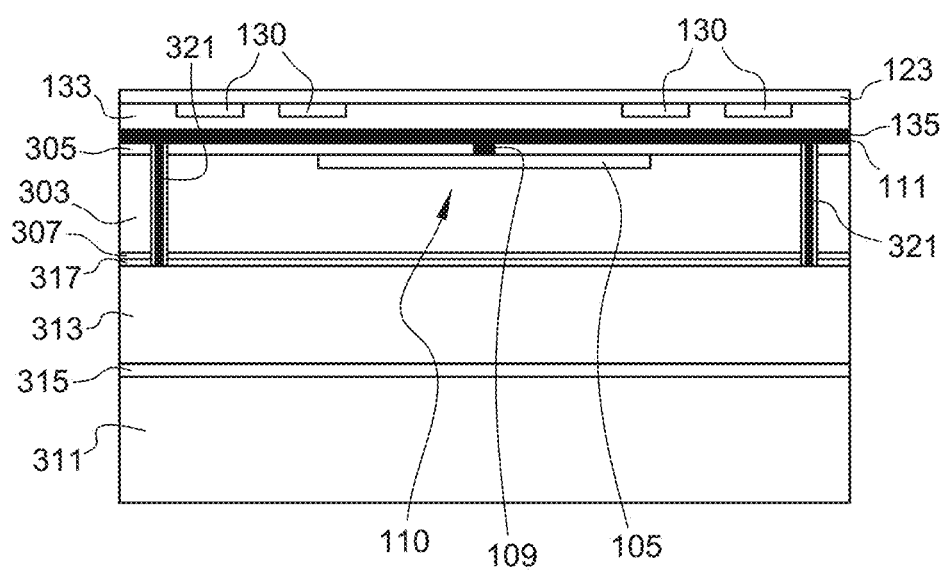

FIG. 10D illustrates the structure obtained after transfer and bonding of an electronic device onto the upper surface of metal layer 111, as described for example in relation with FIGS. 1E and 1F.

Steps similar to what has been described hereabove in relation with FIGS. 1G to 1K may then be implemented.

As an example, after the bonding of a support handle 150 on the side of the surface of the optoelectronic device opposite to the photonic device, the substrate 311 of the visible sensor may be removed. Optical elements (not shown) such as color and/or infrared filters and/or microlenses may be formed on the side of the surface of semiconductor layer 313 opposite to active photodetector stack 303.

As a variant, not shown, before the transfer of the structure of FIG. 10B onto the structure of FIG. 10A, optical elements, not shown, for example microlenses, for example, made of silicon, and/or optical structures of meta-surface type, for example, made of silicon, may be formed on the upper surface side of the dielectric layer 317 of the structure of FIG. 10B. Such optical elements buried between the visible sensor and the infrared sensor enable to focus towards the photodiodes 110 of the infrared sensor the light transmitted by the visible sensor.

The alternative embodiment of FIGS. 10A to 10D may be combined, in particular, with the variants of FIGS. 3A and 3B and 8A to 8C.

Various embodiments and variants have been described. Those skilled in the art will understand that certain features of these various embodiments and variants may be combined, and other variants will occur to those skilled in the art. In particular, the described embodiments are for example not limited to the examples of materials and of dimensions mentioned hereabove.

Finally, the practical implementation of the described embodiments and variations is within the abilities of those skilled in the art based on the functional indications given hereabove.

The invention claimed is:

1. Optoelectronic device manufacturing method, comprising the steps of:
    a) forming a photonic device comprising a plurality of photonic components formed inside and on top of a stack of one or a plurality of semiconductor layers coating a first substrate;
    b) forming an electronic device comprising a semiconductor layer coating a second substrate;
    c) after steps a) and b), bonding the electronic device to the upper surface of the photonic device by direct bonding, and then removing the second substrate;
    d) after step c), forming, on the surface side of the electronic device opposite to the photonic device, electric connection metallizations contacting electronic components of the electronic device and the photonic components,
    the method further comprising:
    after step a) and before step c), a step of deposition of a metal layer continuously extending over the entire upper surface of the photonic device; and
    after step c), a step of forming, from the surface of the electronic device opposite to the photonic device, of a plurality of insulating trenches vertically extending through the electronic device and the metal layer, said insulating trenches delimiting in the metal layer a plurality of electrodes electrically insulated from one another,
    wherein step a) comprises a step of transfer and bonding of a first active photonic stack onto a second active photonic stack, the method further comprising, after the bonding of the first active photonic stack to the second active photonic stack and before step c), a step of forming of an insulated conductive via crossing the first active photonic stack and contacting the second active photonic stack.

2. Method according to claim 1, comprising, before step c), the forming of a plurality of electronic components inside and on top of the semiconductor layer coating the second substrate.

3. Method according to claim 1, further comprising, after step c), the forming of a plurality of electronic components inside and on top of the semiconductor layer.

4. Method according to claim 1, wherein, at step c), the electronic device is bonded to the upper surface of the photonic device by direct full plate metal-to-metal, dielectric-to-dielectric, or semiconductor-to-semiconductor bonding.

5. Method according to claim 1, further comprising, after step d), a step of forming of an interconnection stack on the upper surface side of the electronic device.

6. Method according to claim 1, further comprising, after step d), a step of bonding, on the upper surface side of the first electronic device, of a second electronic device comprising a plurality of electronic components formed inside and on top of a semiconductor layer coating a third substrate.

7. Method according to claim 1, wherein the photonic components comprise photosensitive diodes and/or LEDs.

8. Method according to claim 1, wherein the photonic components comprise microbolometers.

9. Method according to claim 1, wherein the first active photonic stack is bonded to the second active photonic stack, by direct metal-to-metal bonding or by direct dielectric-to-dielectric bonding, or by direct semiconductor-to-semiconductor bonding.

10. Method according to claim 1, wherein the photonic device comprises a visible sensor and an infrared sensor stacked to each other, the visible sensor being formed inside and on top of a semiconductor layer and the infrared sensor being formed inside and on top of an active infrared detector stack.

11. Optoelectronic device manufacturing method, comprising the steps of:
a) forming a photonic device comprising a plurality of photonic components formed inside and on top of a stack of one or a plurality of semiconductor layers coating a first substrate;
b) forming an electronic device comprising a semiconductor layer coating a second substrate;
c) after steps a) and b), bonding the electronic device to the upper surface of the photonic device by direct bonding, and then removing the second substrate;
d) after step c), forming, on the surface side of the electronic device opposite to the photonic device, electric connection metallizations contacting electronic components of the electronic device and the photonic components,
the method further comprising:
after step a) and before step c), a step of deposition of a metal layer continuously extending over the entire upper surface of the photonic device; and
after step c), a step of forming, from the surface of the electronic device opposite to the photonic device, of a plurality of insulating trenches vertically extending through the electronic device and the metal layer, said insulating trenches delimiting in the metal layer a plurality of electrodes electrically insulated from one another,
wherein step a) comprises a step of transfer and bonding of a first active photonic stack onto a second active photonic stack, wherein the first active photonic stack is an active photosensitive diode stack and the second active photonic stack is an active LED stack, the method comprising the forming of a cathode contact metallization common to the first active photonic stack and to the second active photonic stack.

12. Optoelectronic device manufacturing method, comprising the steps of:
a) forming a photonic device comprising a plurality of photonic components formed inside and on top of a stack of one or a plurality of semiconductor layers coating a first substrate;
b) forming an electronic device comprising a semiconductor layer coating a second substrate;
c) after steps a) and b), bonding the electronic device to the upper surface of the photonic device by direct bonding, and then removing the second substrate;
d) after step c), forming, on the surface side of the electronic device opposite to the photonic device, electric connection metallizations contacting electronic components of the electronic device and the photonic components,
the method further comprising:
after step a) and before step c), a step of deposition of a metal layer continuously extending over the entire upper surface of the photonic device; and
after step c), a step of forming, from the surface of the electronic device opposite to the photonic device, of a plurality of insulating trenches vertically extending through the electronic device and the metal layer, said insulating trenches delimiting in the metal layer a plurality of electrodes electrically insulated from one another,
wherein step a) comprises a step of transfer and bonding of a first active photonic stack onto a second active photonic stack, the method comprising, before the bonding of the first active photonic stack to the second active photonic stack, a step of deposition of a metal layer on top of and in contact with the upper surface of the second active photonic stack.

13. Method according to claim 12, wherein, on bonding of the first active photonic stack to the second active photonic stack, said metal layer extends continuously over the entire surface of the second active photonic stack.

14. Method according to claim 12, wherein, before the bonding of the first active photonic stack to the second active photonic stack, said metal layer is locally removed by etching to define a plurality of separate electrodes.

* * * * *